(12) United States Patent
Bogursky et al.

(10) Patent No.: US 6,700,079 B2
(45) Date of Patent: Mar. 2, 2004

(54) DISCRETE SOLDER BALL CONTACT AND CIRCUIT BOARD ASSEMBLY UTILIZING SAME

(75) Inventors: Robert M. Bogursky, Encinitas, CA (US); Craig M. Kennedy, San Marcos, CA (US); Kenneth Krone, San Diego, CA (US); Joseph J. Lynch, San Marcos, CA (US)

(73) Assignee: Autosplice, Inc., San Diego, CA (US)

( * ) Notice: Subject to any disclaimer, the term of this patent is extended or adjusted under 35 U.S.C. 154(b) by 34 days.

(21) Appl. No.: 10/084,125

(22) Filed: Feb. 28, 2002

(65) Prior Publication Data

US 2003/0029638 A1 Feb. 13, 2003

Related U.S. Application Data

(63) Continuation-in-part of application No. 09/929,434, filed on Aug. 13, 2001.

(51) Int. Cl.⁷ .................................................. H05K 1/00
(52) U.S. Cl. ...................................... 174/268; 174/262
(58) Field of Search ............................... 174/262–268; 361/772–778

(56) References Cited

U.S. PATENT DOCUMENTS

| | | | | |
|---|---|---|---|---|
| 5,145,104 | A | * | 9/1992 | Apap et al. ............... 228/180.1 |
| 5,338,208 | A | * | 8/1994 | Bross et al. .................. 439/66 |
| 6,137,164 | A | | 10/2000 | Yew et al. |
| 6,189,203 | B1 | | 2/2001 | Heinrich et al. |
| 6,272,741 | B1 | | 8/2001 | Kennedy et al. |
| 6,300,678 | B1 | * | 10/2001 | Suehiro et al. ............. 257/697 |

* cited by examiner

Primary Examiner—David E. Graybill
Assistant Examiner—Jeremy Norris

(57) ABSTRACT

Upper and lower planar circuit boards are connected in spaced apart parallel relationship by a plurality of contacts each made of a conductive pin, insulative collar and solder ball. The upper ends of the pins are inserted in plated though holes in the upper circuit board and soldered thereto by wave soldering or re-flow. The pins have shoulders to establish the penetration of the pins into the upper circuit board. The lower ends of the pins are bonded to conductive pads on the lower circuit board via the solder balls that are maintained in substantially spherical configuration by the insulative collars and accommodate variations in board co-planarity or pin length. Where the lower ends of the pins do not contact their corresponding conductive pads the volume of solder in the solder balls allows reliable fillet solder joints to be formed.

29 Claims, 5 Drawing Sheets

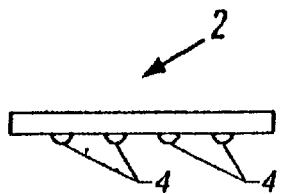
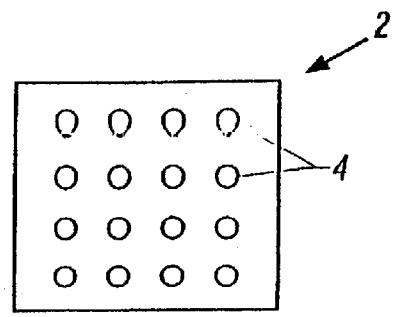
FIG. 1A
(Prior Art)
FIG. 1B
(Prior Art)
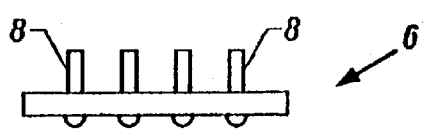
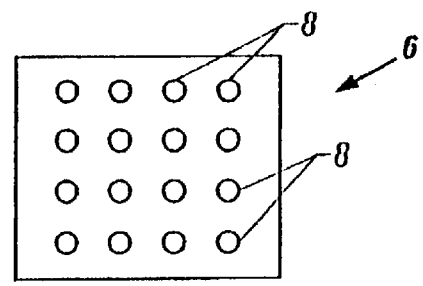
FIG. 2A
(Prior Art)
FIG. 2B
(Prior Art)
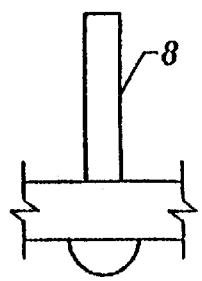
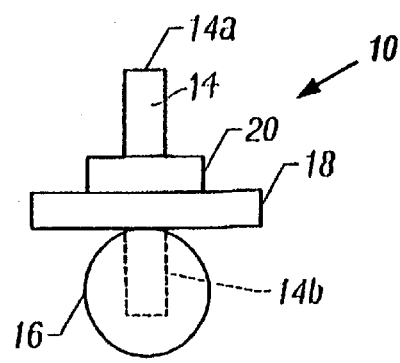
FIG. 2C
(Prior Art)
FIG. 3

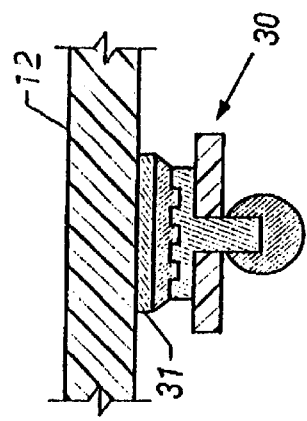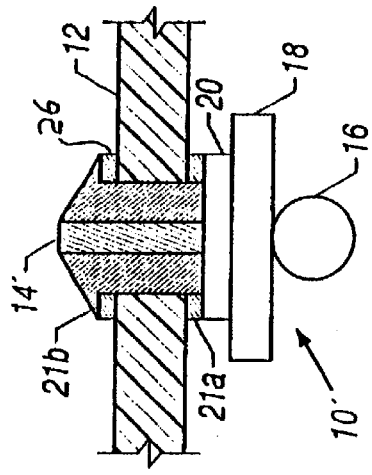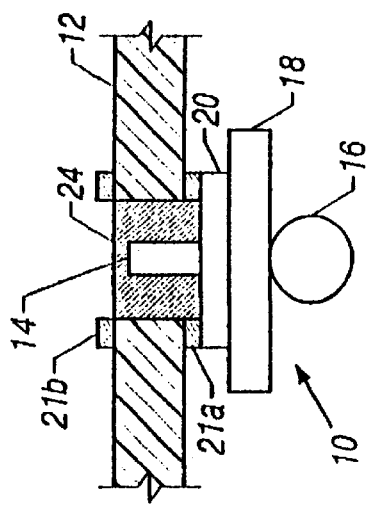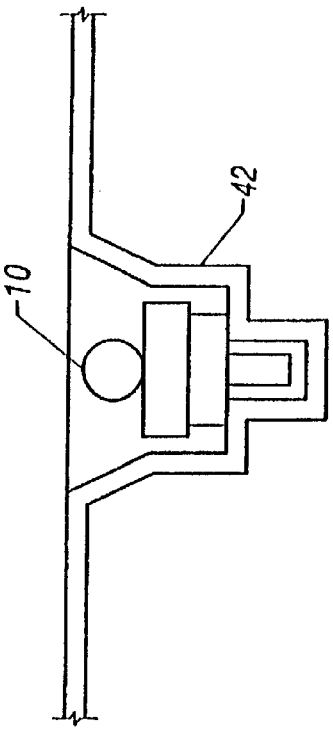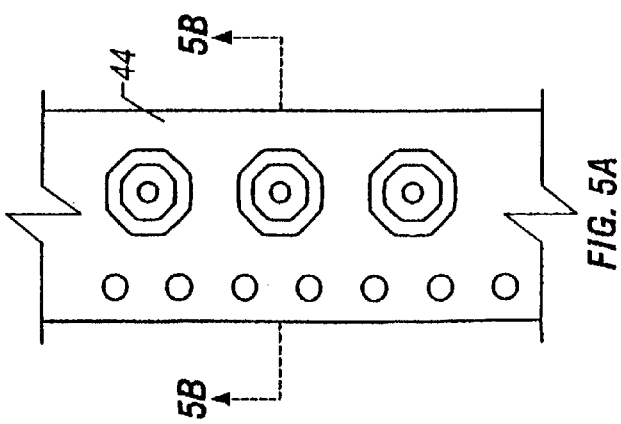

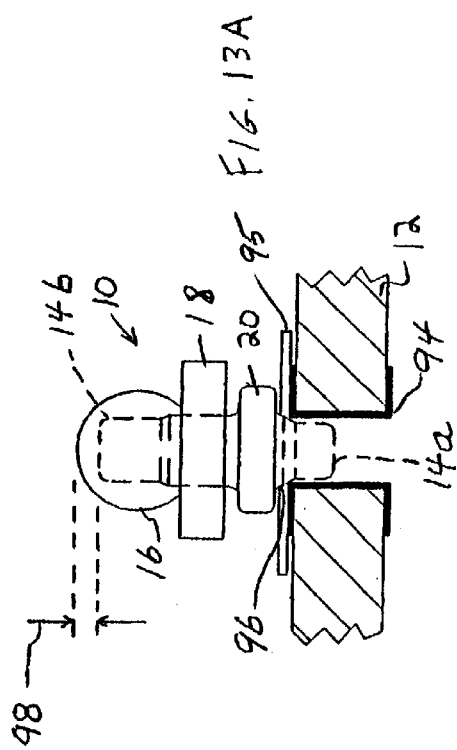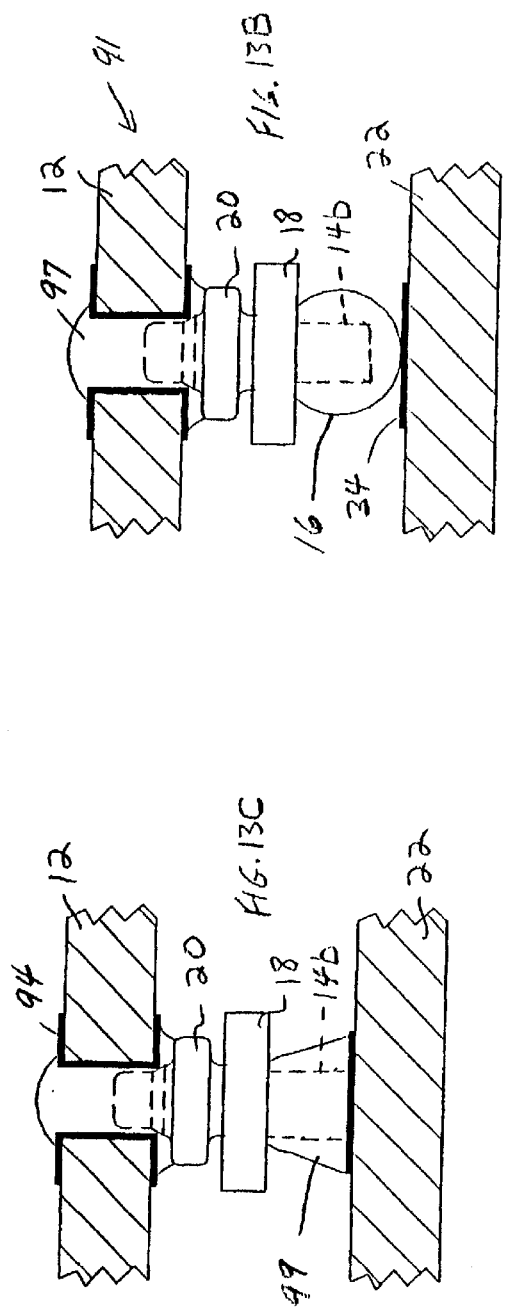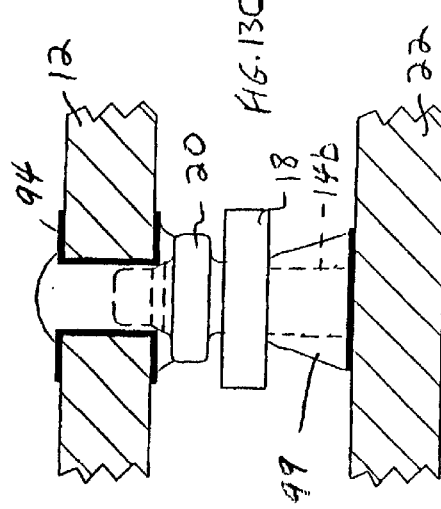

DISCRETE SOLDER BALL CONTACT AND CIRCUIT BOARD ASSEMBLY UTILIZING SAME

CROSS-REFERENCE TO RELATED APPLICATIONS

This application is related to co-pending U.S. patent application Ser. No. 09/122,225 filed Jul. 24, 1998 of Craig Kennedy et al. entitled "Hybrid Solder Ball and Pin Grid Array Circuit Board Inter-Connecting System and Method" and U.S. patent application Ser. No. 09/520,427 filed Mar. 8, 2000 of Gregory K. Torigian et al. entitled "Connector with Base Having Channels to Facilitate Surface Mount Solder Attachment", the entire disclosures of both of which are specifically incorporated herein by reference as though fully set forth.

This application is also a continuation-in-part of U.S. patent application Ser. No. 09/929,434 filed Aug. 13, 2001, the entire disclosure of which is specifically incorporated herein by reference as though fully set forth.

FIELD OF THE INVENTION

The present invention relates to electronic parts and assemblies that utilize surface mount technology (SMT), and more particularly, to the surface mounting of printed circuit boards.

BACKGROUND OF THE INVENTION

Difficulties in surface mount soldering of devices to circuit boards are well known. Some of the key factors that determine the nature and extent of these difficulties are the flatness of the circuit board, the co-planarity of the leads on the device, and the amount of solder required.

When solder paste is applied to a circuit board there needs to be physical contact between the paste and the leads on the device to be soldered in order to permit a proper solder joint to be formed after solder re-flow caused by heating. However, this imposes tight tolerances on the flatness of the circuit board and the co-planarity of the leads on the device. Presently the leads must be within approximately four thousandths of an inch of co-planarity. The thickness of the solder paste needs to be controlled extremely accurately, usually in the range of between six and eight thousandths of an inch. Since the "flatness" of conventional circuit boards can vary as much as ten thousandths of an inch per inch, surface mount connections are usually only made over short distances.

Solder balls have been used to allow SMT devices to be manufactured with wider tolerance ranges as to co-planarity of their leads and to permit the use of circuit boards with wider tolerances with regard to flatness. When pre-applied to either a device or a circuit board, solder balls provide more solder per joint than can typically be supplied with solder paste. So-called ball grid array (BGA) devices have been developed that utilize rows and columns of discrete solder balls to make the required electromechanical interconnections upon solder re-flow. The result is that SMT has been successfully employed with solder balls over areas as large as approximately one and one-half inches square. A conventional BGA device 2 (FIGS. 1A and 1B) has solder balls 4 arranged in a grid pattern of rows and columns. Another conventional device 6 (FIGS. 2A, 2B and 2C) has a grid of balled pins 8. Typically conventional devices that utilize solder balls for attachment only have solder balls or balled pins located on one side and they have no other attachments because it is difficult to add balls or balled pins to a device that already has other components. When balls are added to pins by solder re-flow there must be some method of limiting the flow of solder or else the solder ball will substantially change its shape and thereby lessen its ability to accommodate tolerance variations. Therefore, at present, the type of devices that can be manufactured with balled pins is greatly limited.

There is a substantial need in the electronics industry to surface mount large products that contain other components. In the case of power supplies, for example, it is desirable to surface mount two parallel boards that overlap over a substantial area, e.g., two by four inches. It would also be desirable to surface mount two parallel boards in which one of the boards would have components mounted on both sides of the board. It would also be desirable to mount such large products to circuit boards with pins as well as solder balls but heretofore this has not been practical.

U.S. Pat. No. 6,189,203 describes the use of solder balls to interconnect two boards using surface mount technology on both boards in a power supply application. A problem with this scheme is that the same melting point solder is used for both contacts, since they derive from the common low melting point solder coating on the ball. This means that both the solder connection to the upper board and that to the lower board reflow during the solder reflow temperature, which may cause problems. Moreover, the tolerance in board flatness remains low, which normally cannot exceed the thickness of the thin solder coating on the round ball.

U.S. Pat. No. 6,137,164 describes the use of solder balls to interconnect a lower board using surface mount technology to a rigid interposer board, to the latter of which may be mounted additional components. This scheme suffers from the same disadvantages as described in connection with the earlier mentioned patent, with the additional disadvantage that an additional board is needed for the interconnect system.

The parent application, Ser. No. 09/122,225 (now U.S. Pat. No. 6,272,741), describes a system with some similarities to that of the '164 patent in that an additional carrier board is needed but also requires the presence of a pin connector on the lower board for receiving a pin array on the carrier board to connect to the lower board.

SUMMARY OF THE INVENTION

An object of the present invention is a relatively simple construction for enabling an upper board to be surface mounted to a lower board and that also provides the advantage of increasing the permissible spread in board warpage and/or improved current-carrying ability.

In accordance with the present invention a surface mount contact is provided for attachment to a circuit board. The contact includes an elongate electrically conductive pin defining a shaft having a longitudinal axis and having an upper end and a lower end. A pre-formed heat re-flowable bonding member is attached to the lower end of the pin. An insulator surrounds the shaft of the pin intermediate the upper and lower ends and adjacent the pre-formed heat re-flowable bonding member.

The present invention also provides a circuit board assembly including an upper circuit board and a lower circuit board which are mechanically and electrically interconnected in spaced apart, parallel relationship by a plurality of electrically conductive pins. Each pin has a shaft with upper and lower ends. The upper ends of the pins are attached to the upper circuit board and the pins are arranged in a predetermined pattern. A plurality of separate discrete insulators each surround the shaft of a corresponding pin. The lower circuit board has a plurality of conductive pads arranged in the same predetermined pattern as the pins. A plurality of conductive joints are each formed by re-flow of pre-formed heat re-flowable bonding members previously attached to the lower ends of corresponding pins. Each conductive joint bonds a lower end of a corresponding pin and a corresponding conductive pad and forms an electromechanical connection therebetween.

It will be understood that the terms "upper" and "lower" are not meant to be limiting, but are merely used as a convenient way of identifying opposite ends of the pin or one of two boards. Reversal of the pin would result in the re-flowable bonding member being mounted at the upper pin end, as an example, and reversal of the boards with the pins in their original orientation would result in the upper pin end being mounted to the lower board, as a further example.

A preferred embodiment of our circuit board assembly includes upper and lower generally planar circuit boards held in a predetermined spaced apart relationship by a plurality of discrete electrically conductive pins. Each pin has a shaft with upper and lower ends. The upper ends of the pins are attached to plated through holes in the upper circuit board by a plurality of first solder joints. The pins extend from the underside of the upper circuit board in a predetermined pattern. A plurality of discrete insulators each surround and are permanently attached to the shaft of a corresponding pin. The lower circuit board opposes and is generally parallel with the upper circuit board. The lower circuit board has a plurality of conductive pads arranged in the same predetermined pattern as the pins extending from the upper circuit board. A plurality of second surface-mount solder joints are formed by re-flowing a pre-formed heat re-flowable bonding member attached to and surrounding the lower end of each pin. Each of the second solder joints bonds a lower end of a corresponding pin and a corresponding conductive pad. A first portion of the pins have lower ends that directly contact their corresponding conductive pads and a second portion of the pins have their lower ends spaced slightly above their corresponding conductive pads in a typical situation where the boards do not remain perfectly flat and parallel during the processing.

An alternate embodiment of our surface mount contact includes an elongate electrically conductive pin defining a shaft having a longitudinal axis and having an upper end and a lower end. A pre-formed heat re-flowable bonding member is attached to the lower end of the pin. An insulator with a conductive pad formed on an upper surface thereof surrounds the shaft of the pin adjacent the pre-formed heat re-flowable bonding member. In the preferred embodiment, the re-flowable bonding member is a solder ball surrounding the pin end. This pin with attached solder ball for convenience may from time-to-time be referred to as a pinned solder ball.

BRIEF DESCRIPTION OF THE DRAWINGS

FIGS. 1A and 1B are simplified side elevation and top plan views, respectively, of a conventional ball-only BGA device.

FIGS. 2A and 2B are simplified side elevation and top plan views, respectively of a conventional pin and ball BGA device.

FIG. 2C is an enlarged side elevation view of one of the ball equipped pins of the BGA device illustrated in FIGS. 2A and 2B.

FIG. 3 is an enlarged side elevation view of a discrete solder ball contact in accordance with a first embodiment of the present invention.

FIG. 4A is a fragmentary vertical sectional view illustrating re-flow soldering of the upper end of the contact of FIG. 3 into a plated through hole in an upper circuit board.

FIG. 4B is a fragmentary vertical sectional view similar to FIG. 4A illustrating wave soldering of the upper end of a contact with a longer pin into a plated through hole in the upper circuit board.

FIG. 4C is a fragmentary vertical sectional view illustrating surface mounting of the upper end of an alternate embodiment of our contact to the underside of an upper circuit board.

FIG. 5A is a fragmentary top plan view illustrating tape and reel packaging of the discrete solder ball contact of FIG. 3.

FIG. 5B is a sectional view of the tape and reel packaging taken along line 5B—5B of FIG. 5A.

FIGS. 13A, B and C are enlarged partly-sectional views of two circuit boards before a pin with an attached solder ball is connected to either of the boards, after it is connected to the upper board but before it is connected to the lower board, and after it has been connected to both boards, respectively.

DESCRIPTION OF THE PREFERRED EMBODIMENTS

Figure 6:
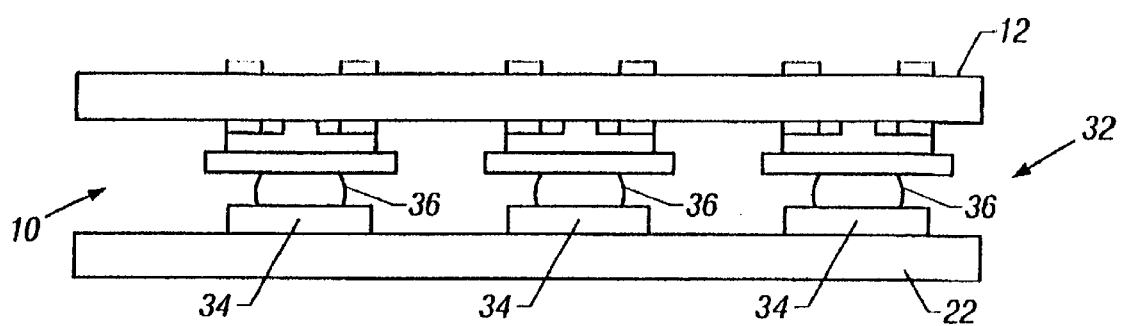
FIG. 6 is an enlarged side elevation view illustrating a circuit board assembly fabricated with a plurality of the discrete solder ball contacts of the type illustrated in FIG. 3.

Referring to FIG. 3 a first embodiment of our surface mount contact 10 for attachment to a planar circuit board 12

(FIGS. 4A and 4B) includes an elongate electrically conductive pin 14 defining a cylindrical shaft having a longitudinal axis and having an upper end 14a and a lower end 14b. A solder ball 16 is soldered, bonded or otherwise attached to the lower end 14b of the pin 14. An insulator 18, for example, in the form of an extended body such as a cylindrical collar, surrounds the shaft of the pin 14 intermediate the upper and lower ends 14a and 14b and abuts the solder ball 16. The function of the insulator 18 is to prevent the solder ball 16 from significantly changing shape. The solder ball 16 preferably wraps around the lower end 14b of the pin 14 so that it covers both the flat circular end of the pin 14 and the lower portion of the cylindrical sidewall thereof. The pin 14 is preferably provided with a shoulder 20 above the insulator 18 for establishing a predetermined vertical position of the pin along the longitudinal axis relative to a reference surface which it abuts, which is the underside of the circuit board 12. The shoulder 20 need not be integrally formed with or soldered to the pin 14 but could be a separate part mounted on the shaft of the pin 14.

FIG. 4A is a fragmentary vertical sectional view illustrating re-flow soldering of the upper end 14a of the pin 14 of the contact 10 into a plated through hole in the upper circuit board 12. The shoulder 20 abuts a conductive donut 21a on the underside of the upper circuit board 12 to control the depth of penetration of the shaft of the pin 14 so that it terminates below the upper side of the circuit board 12. The resulting solder joint 24 firmly mechanically attaches the contact 10 to the upper circuit board 12 and provides an electrical connection through the pin 14 to a conductive circuit trace (not illustrated) terminating in another conductive donut 21b on the upper side of the upper circuit board 12 that contacts the plated through hole.

FIG. 4B illustrates a slightly different version of the contact 10' that has a longer pin 14' that extends all the way through the plated through hole in the upper circuit board 12. Conventional wave soldering techniques are used to form a solder joint around the pin 14' that includes a fillet 26 at the upper end of the joint.

FIG. 4C is fragmentary vertical sectional view illustrating surface mounting of the upper end of an alternate contact 30 to a conductive pad 31 conventionally formed on the underside of the upper circuit board 12. The contact 30 is described later on in connection with FIG. 10.

Contacts such as 10 can be used to fabricate a circuit board assembly 32 (FIG. 6) that includes the upper circuit board 12 and a planar lower circuit board 22 that opposes the upper circuit board 12 in spaced apart generally parallel relationship with the upper circuit board 12. The contacts 10 are attached to the upper circuit board 12 in a predetermined pattern, which may be rows and columns, or any other pattern. The upper ends 14a of the pins are inserted in plated through holes in the upper circuit board 12 and soldered thereto. At this time, the metal shoulders 20 also become bonded by the same solder to the underside of the plated through holes. The lower circuit board 22 has a plurality of conductive pads 34 formed on the upper side thereof in the conventional manner which are arranged in the same predetermined pattern as the contacts 10 and their pins 14 in order to be complementary with the upper circuit board 12. A plurality of solder joints such as 36 and 38 (FIGS. 7A and 7B) each formed by re-heating the solder ball 16 on each contact bridge any small distance between the lower end 14b of each corresponding pin 14 and its corresponding conductive pad 34. The solder joint 36 (FIG. 7A) is substantially rounded and results when the lower end of the pin 14' contacts the conductive pad 34. The solder joint 38 (FIG. 7B) has the shape of a fillet and results when the lower end of the pin 14' is spaced slightly above the conductive pad 34. The fillet shape of the solder joint 38 can also result from the insulator 18 being spaced too far above the solder ball 16. The solder ball 16 must have a sufficient quantity of solder such that when re-flowed, it will accommodate any pin and/or board non-co-planarity.

Thus the preferred embodiment of our circuit board assembly 32 includes upper and lower circuit boards 12 and 22 that are connected in closely spaced apart co-planar relationship by a plurality of contacts such as 10 or 10' each including a pin such as 14. The upper ends 14a of the pins 14 are inserted in plated holes in the upper circuit board 12 and soldered thereto by wave soldering or re-flow. The pins 14 have shoulders 20 to establish the penetration of the pins 14 into the upper circuit board 12. The lower ends 14b of the pins 14 are bonded to conductive pads 34 on the lower circuit board 22 via solder balls 16 that form the solder joints 36 and 38 that together accommodate variations in pin and/or board co-planarity. The insulative collar 18 surrounding the shaft of each pin 14 intermediate its ends ensures that the exposed lower ends 14b of the pins 14 to be soldered completely around their circumference. The solder joint 38 extends around the outer cylindrical circumference of the lower end of the pin 14 and to its circular lower end to provide increased strength of attachment.

The insulator 18 (FIG. 3) is preferably press fit over the shaft of the pin 14. The insulator 18 is preferably made of a suitable plastic resin that can withstand high temperatures without degradation, such as a liquid crystal polymer or glass-filled epoxy or other non-wickable material. The insulator 18 is spaced above the lower end 14b of the pin 14 to permit the lower end 14b to be soldered around its entire circumference. A primary function of the insulator 18 is to provide a tight seal that prevents any of the solder from the re-flowed solder ball 16 from flowing past the insulator 18 along the shaft of the pin 14. The insulator 18 also prevents the solder ball 16 from dramatically changing its shape during attachment of the upper end 14a to the upper circuit board 12 and during subsequent re-heating to form a bond between the solder ball 16 and the conductive pad 34 on the lower circuit board 22. The pin 14 preferably has a round cross-section and is made of Copper or a Copper alloy or other high conductivity material and thus adds mass to carry higher currents and provide good electrical conductivity. The pin 14 may be plated with Tin/Lead over Nickel or other suitable materials commonly used to fabricate electrical contacts that are to be soldered.

The contacts such as 10 can be packaged in receptacles 42 (FIG. 5B) in a conventionally formed tape 44 (FIG. 5A) wound on a reel and inserted in a feeder in an automatic pick and place machine. Placement on circuit boards can be accomplished utilizing a vacuum pick up nozzle. The pickup nozzle via suction sucks in the solder ball 16 after vision equipment sees the insulator 18 or the shoulder 20 (depending upon which is larger in diameter), and fastens to the insulator 18. This allows the automatic pick and place machine to place the pin 14 into a plated through-hole in the circuit board 12. Where the upper end of a contact such as 30 (FIG. 4B) is surface mounted the pick and place machine would put the upper end on the corresponding conductive pad. Conventional pin-in-paste, wave soldering or reflow soldering techniques can be used. At present the preferred design is to make the diameter of the insulator 18 larger than that of the OD of the pickup nozzle and larger than that of the shoulder 20 but the arrangement could be vice versa. It is also possible for the diameter of the solder ball 16 to be the largest diameter on the contact 10 so that it would be recognized by the vision equipment.

High temperature solder is preferably used for bonding the upper ends of the contacts 10, 10' or 30 to the upper circuit board 12 so that when the solder ball 16 is subsequently re-flowed to attach the contact to the lower circuit board 22, the attachment of the contact to the upper circuit board 12 would not be adversely affected, such as by re-flowing. Stated another way, the solder that bonds the upper ends of the contacts to the upper circuit board 12 preferably has a higher melting temperature than that of the solder balls 16. The melting point of the solder balls 16 depends upon the choice of the alloy for the solder which they are made from. When the solder balls 16 are re-flowed, they should preferably retain their substantially rounded shape illustrated in FIG. 7A.

Figure 7A:
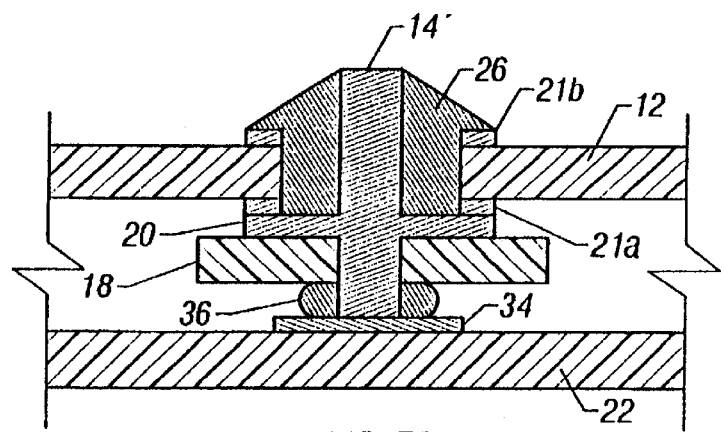
FIG. 7A is an enlarged fragmentary vertical sectional view of the circuit board assembly of FIG. 6 illustrating the preferred solder ball joint achieved by re-flowing the solder ball of the contact of FIG. 3 when the lower end of the pin and its corresponding conductive pad contact each other.
Figure 7B:
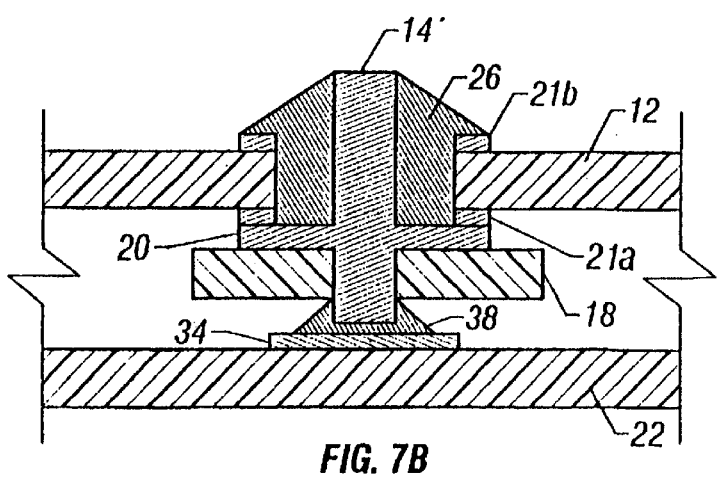
FIG. 7B is an enlarged fragmentary vertical sectional view of the circuit board assembly of FIG. 6 illustrating a less desirable but still functional solder fillet joint obtained by re-flowing the solder ball of the contact of FIG. 3 when the lower end of the pin is spaced slightly above its corresponding conductive pad.

When the contacts such as 10 are bonded to the conductive pads 34 on the lower circuit board 22 the upper circuit board 12 may be sufficiently heavy so that the lower ends 14b of some of the pins 14 actually rest on the conductive pads 34 as illustrated in FIG. 7A to provide a predetermined minimum spacing between the upper and lower circuit boards 12 and 22. Some of the lower ends 14b will not touch their corresponding conductive pads 34 as illustrated in FIG. 7B, due to non-co-planarity of the pins 14 and/or the lower circuit board 22. However, reliable solder joints 36 or 38 (FIGS. 7A and 7B) will still be formed due to the volume of solder in the balls 16 and the size of the conductive pads 34. These characteristics, as well as the size of the pins 14 and the amount of the pins 14 that are within the solder balls 16 should be carefully selected to provide the proper volume and height of solder for a good connection.

Figure 8A:
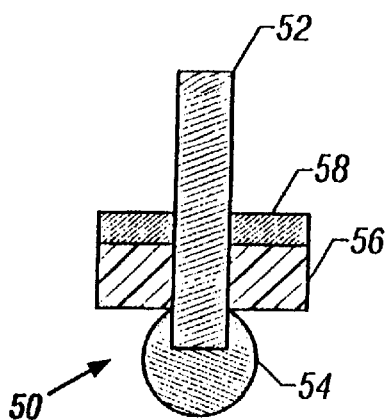
FIG. 8A is an enlarged vertical sectional view of an alternate embodiment of the contact that uses an insulator with a plated conductive pad and is adapted for through-hole mounting to a circuit board.

FIG. 8A illustrates an alternate embodiment of the contact 50 that is adapted for through-hole mounting to a circuit board. It includes a straight pin 52 that has a solder ball 54 attached to its lower end. A cylindrical insulator 56 is press fit over and surrounds the pin 52 and has a plated on conductive pad 58 on the upper side thereof. The insulator 56 and conductive pad 58 can be formed as a miniature circuit board made of Copper clad glass-epoxy PCB material. The insulator 56 serves to maintain the shape of the solder ball 54, while its conductive pad 58 allows the contact 50 to be soldered to a conductive pad such as 31 (FIG. 4C) formed on the lower side of an alternate form of the upper circuit board 12. The insulator 56 can be placed at various longitudinal positions along the straight pin 52 to permit different spacings between the upper and lower circuit boards 12 and 22 to be established. In addition, adjusting the position of the insulator 18 relative to the lower end of the pin allows control of the solder ball shape. The contact 50 may not have as much current carrying capacity as the contact 10 (FIG. 3) since the former has less overall metal content however it may be easier and cheaper to fabricate.

Figure 8B:
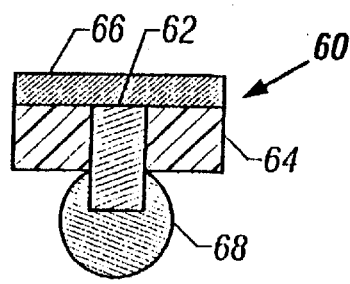
FIG. 8B is an enlarged vertical sectional view of yet another alternate embodiment of the contact that uses an insulator with a plated conductive pad and is adapted for surface mounting to a circuit board.

FIG. 8B illustrates yet another alternate embodiment of the contact 60 that is adapted for surface mounting to a conductive pad 31 on the underside of the upper circuit board 12. It uses a shorter straight pin 62 than the contact 50. A cylindrical insulator 64 with a relatively thick conductive pad 66 on an upper side thereof is press fitted over the straight pin 62. The pin 62 does not extend through the pad 66 so that the conductive pad 66 can be surface mounted and soldered to the conductive pad 31 on the underside of the upper circuit board 12. A solder ball 68 is attached to the lower end of the straight pin 62. The insulator 64 and conductive pad 66 can also be formed as a miniature circuit board made of Copper clad glass-epoxy PCB material.

Figure 9:
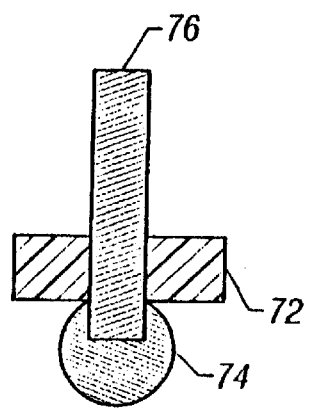
FIG. 9 is an enlarged vertical sectional view of a further alternate embodiment of the contact which is similar to that of FIG. 8A except that the former does not have a plated conductive pad.

FIG. 9 illustrates yet another embodiment 70 that is similar to the embodiment 50 of FIG. 8A except that the latter does not have any conductive pad on the upper side of its insulator 72. A solder ball 74 is attached to the lower end of a straight pin 76. The upper end of the straight pin 76 is soldered in place in the plated through hole in the upper circuit board 12 but the insulator 72 has no solder attachment to the upper circuit board 12. It merely functions as a spacer and prevents solder wicking. The pin 76 also could be stripped insulated rod or wire. In other words, a length of insulation coated wire could have its ends stripped of the insulation leaving the coating in place at an intermediate pin position. That left-in-place insulator coating, which could have an OD smaller than that of the solder ball 74, would function as the insulator 72 of the invention and prevent solder wicking from the ball at the lower stripped end to the upper end. If the coating were made sufficiently thick, it could also act as a stop. Alternatively, a metal collar 20 can be added on top to act as the stop. As a further alternative, an insulating coating can be applied to an intermediate location on a bare wire or rod to serve as the insulator.

Figure 10:
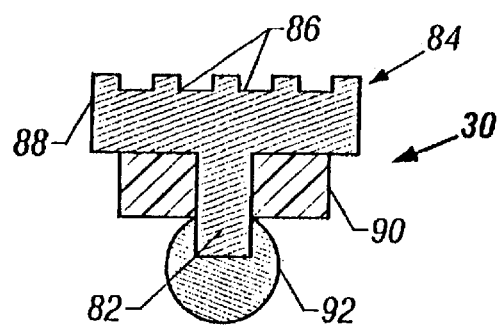
FIG. 10 is an enlarged vertical sectional view of still another embodiment of the discrete solder ball contact of the present invention that has a channeled head for surface mounting.

FIG. 10 illustrates yet another embodiment of our contact 30. It is similar to the contact 10 except that the shoulder 20 is eliminated and instead the upper end of the pin 82 is formed with a cylindrical head 84 for surface mounting to conductive pads such as 31 (FIG. 4C) formed on the underside of the upper circuit board 12. The head 84 is formed with a plurality of outwardly opening radially extending channels 86 in its upper surface. The upper surface of the channeled head 84 provides the principal contact with the conductive pad 31 on the underside of the circuit board 12. The channels preferably also open through the peripheral cylindrical outer wall 88 of the head 84 to permit out-gassing of vaporized solder flux. This minimizes skating and aids in self-centering of the pin to the pad during solder re-flow. Solder joint strength is also improved because the channels 86 increase the area of contact between the re-flowed solder and the head 84 of the pin 82. The channels 86 could be formed by a plurality of diametric channels that intersect in the middle of the head 84 or a cris-cross pattern. The head 84 could have a wide variety of configurations as described and illustrated in U.S. patent application Ser. No. 09/520,427 incorporated by reference above. A cylindrical insulator 90 is press fit over the shaft of the pin 82 until it abuts the head 84. A solder ball 92 is attached to the lower end of the pin 82.

In the embodiments described so far, the contacts have utilized the solder ball 16 to make a connection to a lower circuit board 22. However it will be understood by those skilled in the art that the solder ball 16 could be replaced with a wide variety of pre-formed heat re-flowable conductive bonding members that can be heated to cause them to re-flow, and thereafter when allowed to cool and re-solidify, will provide an electromechanical connection between the lower end of the pin 14 and the conductive pad 34. Heat for re-flow is preferably supplied via a conventional convection oven and other conventional heating techniques for solder re-flow may be used.

Figure 11:
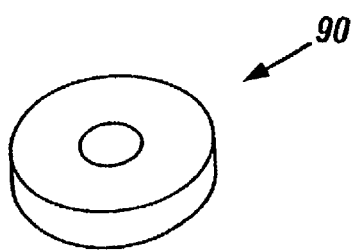
FIGS. 11 and 12 illustrate cylindrical and square washer-like pre-formed heat re-flowable bonding members, respectively, that may be used in place of the solder ball of the connector of FIG. 3.
Figure 12:
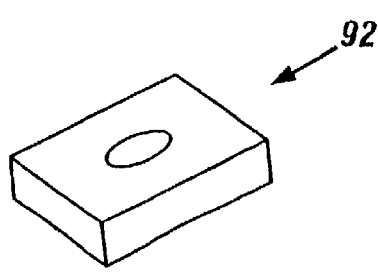

FIGS. 11 and 12 illustrate cylindrical and square preformed washer-like solder elements 90 and 92, respectively, that can be formed on, or press fitted over, the lower end of the pin 14. They may surround the lower end 14b of the pin so that they are flush with its perpendicular lower circular surface. The elements 90 and 92 may also be spaced below the lower end 14b of the pin 14, or extend above the same. The elements 90 and 92 may abut the insulator 18 or be slightly spaced below the same.

When the customer solders the upper ends of the contact 10 in the plated through holes of the upper circuit board 12, the elements 90 and 92 will re-flow and form solder balls adjacent the insulator 18. These solder balls may cool and harden as the assembly moves down to the next automatic fabrication station where the upper circuit board 12 with its array of attached pins 14 can be inverted and placed on top of the second circuit board 22 before re-flowing the solder balls. The pre-formed heat re-flowable bonding members could also take the form of a discrete quantity of a suitable solder paste applied to the lower ends 14b of the pins in a manner to ensure that the paste will adhere thereto during the assembly and re-flow operations. Besides Tin/Lead alloys, the pre-formed heat re-flowable bonding member attached to the lower end 14b of each contact 10 may be made of Tin-Bismuth alloy, conductive epoxy, brazing compound, welding compound and the like. Thus one skilled in the art will appreciate that the circuit board assembly 32 could be fabricated with these various different types of pre-formed heat re-flowable bonding members in which case the lower ends 14b of the pins 14 would be bonded with conductive joints formed by re-flow, but not necessarily joints made of solder. Similarly, the upper ends 14a of the pins could be connected to the upper circuit board 12 with conductive joints formed by re-flow, but not necessarily joints made of solder.

FIGS. 13A–C show more clearly a preferred embodiment of the invention in which parallel boards 12, 22 are interconnected by a plurality of discrete laterally-spaced pinned solder balls 10, only one of which is shown. The components mounted on the boards are not shown, but in a power supply application, typically, the upper board 12 would be populated on both sides with electronic components. The free upper (from the FIG. 3 standpoint) pin end 14a is shown in FIG. 13A seated in the metallized via or plated through-hole 94 before reflow. In this embodiment, the metal flange 20 is slightly axially-spaced above (from the FIG. 3 standpoint) the insulator 18. This spacing can be adjusted for tolerance reasons and to provide the capability for making different protrusion lengths 14b beyond (below) the insulator to optimize ball size and shape. It will also be observed that a tapered section 96 joins the free pin end 14a to the flange 20. This provides the important advantage of allowing the hole 94 to be larger to allow for placement tolerances (of the pin in the hole), but at the same time it ensures that the pin centers properly when the paste 95 provided in the via is reflowed. The tapered section thus helps centering before and after reflow. FIG. 13B shows the assembly after the first reflow 97 of the free pin ends 14a of the interconnects 12 into their respective via. FIG. 13C shows the assembly after the second reflow 99 of the ball ends 16 of the interconnects 12 to their respective pad 34.

A typical application to demonstrate the advantages of the invention is as follows. The supplier, for example, of a power module will place each of the free ends 14a of the multiple discrete pins into their respective vias in the first board 12, oriented ball up as shown in FIG. 13A, and then the assembly undergoes a first reflow, simultaneously soldering a first series of components to that same side of the board, ultimately becoming the lower side of the first board. The result is a power module board 91 from which protrudes a number of solder balls 16 each surrounding their respective pin end. That first assembly 91 can then be sold to a customer who plans to supply a second board 22 to which the first board is to be attached. This customer will first paste (apply paste to) the pads on his second board, seat the first assembly solder ball facing downward on the lower board 22 as shown in FIG. 13B, and then in a second step reflow the solder (paste and balled pin) to attach the assembly (power module) to his second board (ball down) as shown in FIG. 13C. The weight of the power module assembly 91 will cause some of the pins 14b at the balled ends to seat on the second board pad 34 when it is reflowed. Typically, at least 3 pins, for stability, should make contact with the second board pads (or there should be very little solder between the board and these pins, depending on the buoyancy of the solder and the weight of the assembly). The other pins will typically be further away due to tolerances, coplanarity, or board warpage. It is the solder ball thickness below the pin end, i.e., the amount of solder below the pin end 14b, designated 98, that permits all the balls 16 to touch the paste and/or pad and reflow properly. Also, to make a good solder joint and have it survive through mechanical and environmental conditions (mostly changes in temperature) a significant amount of solder is required.

At the same time that the first board is soldered to the second board, or if desired, before that second reflow or even after the second reflow, either or both sides of the first board can be populated with components. Also, at the same time that the first board is soldered to the second board, or if desired, before that second reflow or even after the second reflow, the second board can be populated with components. It is practical to have four or more reflows in this scheme: first, forming the balls 16 to surround the lower ends 14b of the pins; second, soldering the pins and components to the first board; third, soldering components to the opposite side of the first board; fourth, soldering the first board to the second board, as well as additional reflows for repair or removal. In general, while not essential, it is preferred that the solders used during the successive steps have decreasing melting temperatures to minimize the number of reflows that a solder joint undergoes.

As indicated earlier, the pin, being of metal and having a higher conductivity than solder material, increases the current-carrying ability of the solder joint at the hole. Also, the contacts illustrated in FIGS. 8B and 10 have the advantage that they are normal surface mount solder joints that do not require a hole for a free pin end, while at the same time they offer the advantage of separation of the solder materials at opposite pin ends as explained in greater detail below, and moreover the surface mount solder joint at top can remain fixed in position while the solder ball joint at the bottom may be adjusting during reflow to accommodate board position changes.

The discrete metal flange 20, or shoulder as it has sometimes been called, is of special importance in the assembly process described above, because it virtually seats against the bottom surface of the first board and thus provides additional surface area and fillet area for soldering to ensure that the pin does not separate from the first board during the second reflow or subsequent processing. The flange 20 also acts as a stop to prevent the pin 14a from penetrating too deeply into the via 94, and guarantees the minimum interboard spacing—from the pin bottom to the flange top—to ensure adequate heat dissipation space for components on the bottom side of the first board or the top side of the second board. For a typical pin axial length of about 0.08–0.2 inches, the board spacing can be as small as about 0.8–0.17 inches. For these dimensions, a typical flange diameter is about 0.08 inches, a typical insulator diameter is about 0.15 inches, and a typical ball diameter is about 0.05–0.1 inches. The metal flange 20 has to be sized to fit the annular plated ring around the via in the first board to solder best.

The discrete insulator 18, likewise, is highly important to the success of the procedure. It should be tightly fitted in a permanent mount to the pin 14, to provide an annular seal against solder migration from the ball 16 along the pin shaft during any of the early reflows. It thereby maintains the amount of solder on the pin end 14b allowing it to remain generally ball shaped or at least providing solder beyond the pin end and surrounding the pin end before the soldering to the second board. It will also be understood that the insulator 18 can have shapes other than cylindrical, and as explained in connection with FIG. 9 can also be an insulating coating of small diameter on the pin to prevent wicking.

It will also be appreciated that a feature of the invention is that the solder at the pin end—for example, 95, 97 in FIGS. 13A, B—and the solder of the solder ball 16 are not allowed to commingle by reason of the insulator separator 18. This has the advantage of allowing more flexibility in the choice of soldering materials, such as different melting points or other properties of the separate solder materials, and also allows additional control of the ball shape.

These figures illustrate that configuration in which the pin is cylindrical, and the ball is spherical with a diameter chosen such that the pre-solder-flow solder thickness between the pin end and the top surface of the solder ball (in the view shown in FIG. 13A), indicated in FIG. 13A by reference 98, is about 0.010–0.020 inches. The significance of this thickness is that it indicates that the pinned solder ball component as part of a multiple board interconnect system will tolerate as much as about 0.015 inches of warping or out-of-flatness in one or both of the boards and still provide reliable soldered connections to both boards. In the preferred arrangement, the soldering of the pin end uses a higher-temperature solder (for example, 90Sn/10Pb) which will not reflow when the lower-temperature solder of the solder ball (for example, 63Sn/37Pb) is reflowed.

In the preferred arrangement, the ball ends are surface mounted to planar pads. In principle, it is possible to solder the ball end to a via, but this has disadvantages and is not recommended. The reason is that the via would have to either be pre-filled (with a pin or solder or paste) or a lot of solder would be required on the ball to allow it to both fill the via and still maintain a good solder joint between the pin and board (either with the pin sitting on the via or in the via itself).

In several views of the drawings, for example, FIGS. 4A, 4B, 7A, 7B, the platings 21a and 21b on opposite board sides can represent outer parts of a plated through-hole, the inner connecting part being omitted for clarity, or separate pads on the top and bottom sides of the board that become interconnected by the soldered pin. Also, the FIG. 4A embodiment can represent a single-sided board with the soldered pin providing a connection to a trace on one board side. It will also be understood that the vias for the pins need not be plated.

While we have described several embodiments of our discrete contact with attached heat re-flowable bonding member and circuit board assemblies made therewith, it will be understood by those skilled in art that our invention may be modified in both arrangement and detail. The use of the words "upper" and "lower" is merely for convenience in describing the structures illustrated. The boards and pins could be assembled and/or used in any orientation. Therefore, the protection afforded our invention should only be limited in accordance with the scope of the following claims.

We claim:

1. A surface mount contact for attachment to a circuit board, comprising;
   an elongate electrically conductive pin defining a shaft having a longitudinal axis and having an upper end and a lower end;
   a pre-formed heat re-flowable bonding member attached to the lower end of the pin; and
   a discrete insulator surrounding the shaft of the pin intermediate the upper and lower ends and adjacent the pre-formed heat re-flowable bonding member,
   said discrete insulator comprising a collar extending laterally from the shaft.

2. The surface mount contact of claim 1 wherein the pin has a cylindrical cross-section.

3. The surface mount contact of claim 1 wherein the upper end of the pin is formed with a head with an outer surface that is dimensioned to be positioned on, and bonded to, a conductive pad on a circuit board, and the lower end of the pin is dimensioned and configured to be attached to a lower circuit board.

4. The surface mount contact of claim 1 wherein the pin is provided with a conductive shoulder between the upper end of the pin and the insulator for establishing a predetermined vertical position along the longitudinal axis relative to a reference surface.

5. The surface mount contact of claim 1 wherein the pre-formed heat re-flowable bonding member is a solder ball.

6. The surface mount contact of claim 1 wherein the insulator is made of a high temperature plastic resin or a printed circuit board material.

7. The surface mount contact of claim 1 wherein the insulator collar is press-fitted around the pin.

8. The surface mount contact of claim 1 wherein the pin is of copper or a copper alloy.

9. A surface mount contact for attachment to a circuit board, comprising:
   an elongate electrically conductive pin defining a shaft having a longitudinal axis and having an upper end and a lower end,
   a pre-formed heat re-flowable bonding member attached to the lower end of the pin,
   an insulator surrounding the shaft of the pin intermediate the upper and lower ends and adjacent the pre-formed heat re-flowable bonding member,
   the upper end of the pin being formed with a head with an outer surface that is dimensioned to be positioned on, and bonded to, a conductive pad on a circuit board, and the lower end of the pin being dimensioned and configured to be attached to a lower circuit board,
   the head being formed with at least one channel that opens through an outer surface of the head and a peripheral wall of the head.

10. A surface mount contact for attachment to a circuit board, comprising:
    an elongate electrically conductive pin defining a shaft having a longitudinal axis and having an upper end and a lower end,
    a pre-formed heat re-flowable bonding member attached to the lower end of the pin,
    an insulator surrounding the shaft of the pin intermediate the upper and lower ends and adjacent the pre-formed heat re-flowable bonding member,
    the pre-formed heat re-flowable bonding member being a solder ball,
    the insulator having a conductive pad formed on an upper surface thereof surrounding the shaft of the pin adjacent the pre-formed heat re-flowable bonding member.

11. A discrete surface mount contact for soldering to a circuit board, comprising:

an elongate electrically conductive pin defining a shaft having a longitudinal axis and having a free upper end and a lower end;

a pre-formed heat re-flowable solder ball soldered to and fully surrounding the lower end of the pin; and a discrete insulator surrounding and permanently attached to the shaft of the pin adjacent the pre-formed solder ball and sealing the shaft against solder migration;

the insulator having a dimension extending in a lateral direction to a distance exceeding that of a corresponding dimension of the solder ball such that the insulator provides a visible accessable surface to a pickup member.

12. A discrete surface mount contact for soldering to a circuit board, comprising:

an elongate electrically conductive pin defining a shaft having a longitudinal axis and having a free upper end and a lower end, a pre-formed heat re-flowable solder ball soldered to and fully surrounding the lower end of the pin, a discrete insulator surrounding and permanently attached to the shaft of the pin adjacent the pre-formed solder ball and sealing the shaft against solder migration, a discrete conductive collar mounted on and surrounding the shaft of the pin intermediate the insulator and upper end of the pin.

13. The discrete surface mount contact of claim 12 wherein the insulator has an outside diameter that exceeds the outside diameter of the solder ball.

14. The discrete surface mount contact of claim 12 wherein the diameter of the insulator is smaller than the diameter of the solder ball.

15. The discrete surface mount contact of claim 14 wherein the insulator is a coating on an intermediate position of the pin.

16. A circuit board assembly comprising:

an upper circuit board having contact positions;

a plurality of discrete electrically conductive pins each having a shaft with upper and lower ends, the upper ends of each of the pins being attached to the upper circuit board at one of its contact positions and being arranged in a predetermined pattern;

a plurality of insulators in the form of collars each surrounding an intermediate position of the shaft of a corresponding pin, the collars each having a flat surface on the side facing the lower end of a corresponding pin;

a lower circuit board opposing and generally parallel with the upper circuit board, the lower circuit board having a plurality of conductive pads arranged in the predetermined pattern; and a plurality of conductive joints each formed by re-flow of a pre-formed heat re-flowable bonding member attached to the lower end of a corresponding pin, each conductive joint bonding the lower end of a corresponding pin and a corresponding conductive pad and forming an electro-mechanical bond therebetween.

17. The circuit assembly of claim 16 wherein both the attachments of the pin upper ends and the conductive joints are solder joints, and the solder joints are physically separated from one another by their respective insulator such that the solders at the two joints do not commingle.

18. The circuit board assembly of claim 16 wherein the upper ends of the pins are inserted into corresponding vias in the upper circuit board and each pin has a conductive shoulder positioned between the insulator and the upper circuit board that establishes a predetermined longitudinal position of the pin relative to the upper circuit board.

19. The circuit board assembly of claim 16 wherein the upper end of each pin is formed with a head with an outer surface that is dimensioned to be positioned on, and surface bonded to, a second conductive pad on the upper circuit board.

20. The circuit board assembly of claim 16 wherein the pre-formed heat re-flowable bonding member is made of a material selected from the group consisting of Tin/Lead solder, Tin/Bismuth solder, conductive epoxy, brazing compound, welding compound and solder paste.

21. A circuit board assembly comprising:

an upper circuit board having contact positions, a plurality of discrete electrically conductive pins each having a shaft with upper and lower ends, the upper ends of each of the pins being attached to the upper circuit board at one of its contact positions and being arranged in a predetermined pattern, a plurality of insulators each surrounding an intermediate position of the shaft of a corresponding pin, a lower circuit board opposing and generally parallel with the upper circuit board, the lower circuit board having a plurality of conductive pads arranged in the predetermined pattern, a plurality of conductive joints each formed by re-flow of a pre-formed heat re-flowable bonding member attached to the lower end of a corresponding pin, each conductive joint bonding the lower end of a corresponding pin and a corresponding conductive pad and forming an electro-mechanical bond therebetween, each insulator being formed with a second conductive pad that is bonded by a corresponding second solder joint to a corresponding second conductive pad on the upper circuit board.

22. A circuit board assembly comprising:

an upper circuit board having contact positions, a plurality of discrete electrically conductive pins each having a shaft with upper and lower ends, the upper ends of each of the pins being attached to the upper circuit board at one of its contact positions and being arranged in a predetermined pattern, a plurality of insulators each surrounding an intermediate position of the shaft of a corresponding pin, a lower circuit board opposing and generally parallel with the upper circuit board, the lower circuit board having a plurality of conductive pads arranged in the predetermined pattern, a plurality of conductive joints each formed by re-flow of a pre-formed heat re-flowable bonding member attached to the lower end of a corresponding pin, each conductive joint bonding the lower end of a corresponding pin and a corresponding conductive pad and forming an electro-mechanical bond therebetween, a first melting temperature of the solder in the solder joints of the pins to the contact position being above a second melting temperature of the solder in the solder joints that bond the lower ends of the pins to the conductive pads on the lower circuit board.

23. A circuit board assembly comprising:

an upper circuit board having contact positions, a plurality of discrete electrically conductive pins each having a shaft with upper and lower ends, the upper ends of each of the pins being attached to the upper circuit board at one of its contact positions and being arranged in a predetermined pattern, a plurality of insulators each surrounding an intermediate position of the shaft of a corresponding pin, a lower circuit board opposing and generally parallel with the upper circuit board, the lower circuit board having a plurality of conductive pads arranged in the predetermined pattern, a plurality of conductive joints each formed by re-flow of a pre-formed heat re-flowable bonding member attached to the lower end of a corresponding pin, each conductive joint bonding the lower end of a corresponding pin and a corresponding conductive pad and forming an electro-mechanical bond therebetween, the upper end of each pin being formed with a head with an outer surface that is dimensioned to be positioned on, and surface bonded to, a second conductive pad on the upper circuit board, the head being formed with at least one channel that opens through the outer surface of the head and a peripheral wall of the head.

24. A circuit board assembly comprising:

a generally planar upper circuit board having spaced plated through vias;

a plurality of electrically conductive pins each having a shaft with upper and lower ends, the upper ends of the pins being inserted in and attached to the plated through holes in the upper circuit board by a plurality of first solder joints and being arranged in a predetermined pattern;

a plurality of discrete insulators each surrounding the shaft of a corresponding pin;

a generally planar lower circuit board opposing and generally parallel with the upper circuit board, the lower circuit board having a plurality of conductive pads arranged in the predetermined pattern; and a plurality of second solder joints formed by re-flowing a pre-formed heat re-flowable bonding member located on the side of the insulators facing the lower circuit board, each of the second solder joints bonding a lower end of a corresponding pin and a corresponding conductive pad, a first portion of the pins having lower ends that directly contact their corresponding conductive pads and a second portion of the pins having their lower ends spaced slightly above their corresponding conductive pads.

25. The circuit board assembly of claim 24 wherein each of the lower ends of the pins are spaced from the bottom surface of their corresponding re-flowable bonding member by a thickness equal to about 0.010–0.020 inches.

26. The circuit board assembly of claim 24 wherein the upper surface of the insulator has a conductive pad and the upper end of the pin extends above the conductive pad formed on the upper surface of the insulator.

27. The circuit board assembly of claim 24 wherein each of the insulators separates the first and second solder joints such that their solders do not commingle.

28. The circuit board assembly of claim 24 wherein each of the insulators comprises an insulating coating.

29. A circuit board assembly comprising:

a generally planar single-sided circuit board having a plurality of spaced vias each surrounded by an electrically-conductive trace on one of the board's sides;

a plurality of electrically conductive pins each having a shaft with upper and lower ends, the upper end of each of the pins being inserted in and solder bonded to one of the vias in the circuit board by a first solder joint that also electrically connects the pin to the trace;

a plurality of discrete insulators each surrounding the shaft of one of the pins intermediate its upper and lower ends;

a plurality of pre-formed heat re-flowable soldering members each located on the side of one of the insulators adjacent the lower pin end and soldered to and fully surrounding the lower end of the pin;

each discrete insulator sealing to the shaft and preventing solder migration between the first solder joint and the adjacent re-flowable soldering member.

* * * * *